United States Patent
Nitta et al.

(10) Patent No.: US 11,142,829 B2
(45) Date of Patent: Oct. 12, 2021

(54) SEMICONDUCTOR MANUFACTURING APPARATUS MEMBER, AND DISPLAY MANUFACTURING APPARATUS AND SEMICONDUCTOR MANUFACTURING APPARATUS COMPRISING SEMICONDUCTOR MANUFACTURING APPARATUS MEMBER

(71) Applicant: TOTO LTD., Kitakyushu (JP)

(72) Inventors: Yasutaka Nitta, Kitakyushu (JP); Takuma Wada, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 16/802,180

(22) Filed: Feb. 26, 2020

(65) Prior Publication Data
US 2020/0270753 A1 Aug. 27, 2020

(30) Foreign Application Priority Data

Feb. 27, 2019 (JP) .............................. JP2019-033546
Dec. 9, 2019 (JP) ................................. 2019-222021

(51) Int. Cl.
*H01L 21/67* (2006.01)
*C23C 28/04* (2006.01)
*H01J 37/32* (2006.01)
*C23C 30/00* (2006.01)

(52) U.S. Cl.
CPC ............ *C23C 28/042* (2013.01); *C23C 30/00* (2013.01); *H01J 37/32477* (2013.01); *H01L 21/67023* (2013.01)

(58) Field of Classification Search
CPC ..... C23C 28/042; C23C 24/04; C23C 24/082; C23C 28/3455; C23C 30/00; C23C 28/321; C23C 28/347; H01J 37/32477; H01L 21/67023
See application file for complete search history.

(56) References Cited

U.S. PATENT DOCUMENTS

| | | | |
|---|---|---|---|
| 2014/0295670 A1* | 10/2014 | Shih | ...................... C23C 28/322 438/710 |
| 2017/0152189 A1* | 6/2017 | Iwasawa | ............. C04B 41/5045 |
| 2019/0027343 A1 | 1/2019 | Nitta | |

FOREIGN PATENT DOCUMENTS

| | | |
|---|---|---|
| JP | H10-223620 A | 8/1998 |
| JP | 2005-158933 A | 6/2005 |
| JP | 2006-089338 A | 4/2006 |
| JP | 2018-046278 A | 3/2018 |
| KR | 2010-0011576 A | 2/2010 |

OTHER PUBLICATIONS

Wayback machine "https://web.archive.org/web/20141204113801/ http://www.makeitfrom.com/material-properties/1050-Al99.5-3.0255-A91050-Aluminum/" (Year: 2014).*

* cited by examiner

*Primary Examiner* — Yuechuan Yu

(74) *Attorney, Agent, or Firm* — Carrier Blackman & Associates, P.C.; William D. Blackman; Joseph P. Carrier

(57) ABSTRACT

According to one embodiment, a semiconductor manufacturing apparatus member includes a base and a particle-resistant layer. The base includes a main portion and an alumite layer. The main portion includes aluminum. The alumite layer is provided at a front surface of the main portion. The particle-resistant layer is provided on the alumite layer and includes a polycrystalline ceramic. An Al purity of the main portion is 99.00% or more.

12 Claims, 2 Drawing Sheets

SEMICONDUCTOR MANUFACTURING APPARATUS MEMBER, AND DISPLAY MANUFACTURING APPARATUS AND SEMICONDUCTOR MANUFACTURING APPARATUS COMPRISING SEMICONDUCTOR MANUFACTURING APPARATUS MEMBER

CROSS-REFERENCE TO RELATED APPLICATIONS

This application is based upon and claims the benefit of priority from Japanese Patent Application No. 2019-33546, filed on Feb. 27, 2019, and No. 2019-222021, filed on Dec. 9, 2019; the entire contents of which are incorporated herein by reference.

FIELD

Embodiments described herein relate generally to a semiconductor manufacturing apparatus member, and a display manufacturing apparatus and a semiconductor manufacturing apparatus comprising semiconductor manufacturing apparatus member.

BACKGROUND

A semiconductor manufacturing apparatus is used in a manufacturing process of a semiconductor device to perform processing such as dry etching, sputtering, CVD (Chemical Vapor Deposition), etc., in a chamber. Particles may be generated in the chamber from a patterning object, the interior wall of the chamber, etc. It is desirable to reduce such particles because the particles cause a reduction of the yield of the semiconductor device to be manufactured.

To reduce the particles, it is desirable for the semiconductor manufacturing apparatus members used in the chamber and in the periphery of the chamber to be plasma-resistant. Therefore, a method is used in which the front surface of the semiconductor manufacturing apparatus member is coated with a covering film (layer) having excellent plasma resistance. For example, a member is used in which an yttria thermal-sprayed film is formed on the front surface of a base. However, there are cases where cracks and/or peeling occur in the thermal-sprayed film; and the durability is not quite sufficient. It is desirable to suppress peeling between the covering film and the base because peeling of the covering film and/or particle detachment from the covering film causes particle generation. Conversely, semiconductor or liquid crystal manufacturing apparatus members that use a ceramic film formed by aerosol deposition are discussed in JP-A 2005-158933 and KR-A 20100011576.

Recently, semiconductor devices are being downscaled; and nanolevel particle control is desirable.

SUMMARY

According to the embodiment, a semiconductor manufacturing apparatus member includes a base and a particle-resistant layer. The base includes a main portion and an alumite layer. The main portion includes aluminum. The alumite layer is provided at a front surface of the main portion. The particle-resistant layer is provided on the alumite layer and includes a polycrystalline ceramic. An Al purity of the main portion is 99.00% or more.

DETAILED DESCRIPTION

Figure 1:
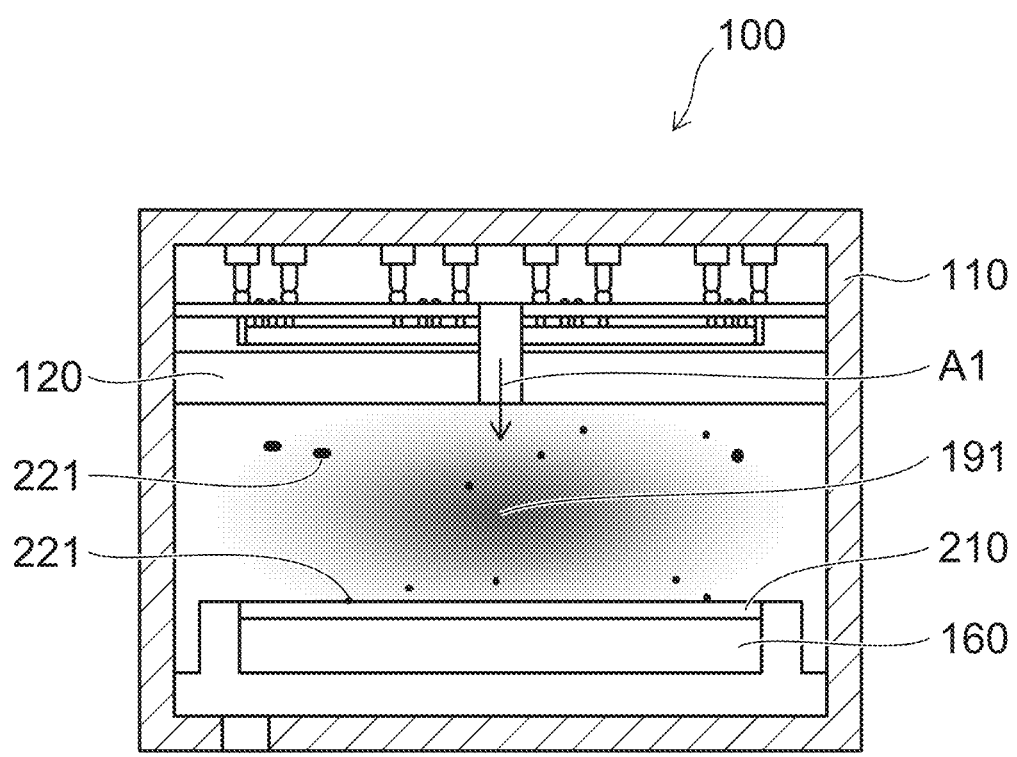
FIG. 1 is a cross-sectional view illustrating a semiconductor manufacturing apparatus including a semiconductor manufacturing apparatus member according to an embodiment.

A semiconductor manufacturing apparatus member according to the invention includes a base and a particle-resistant layer; the base includes a main portion including aluminum, and an alumite layer provided at a front surface of the main portion; the particle-resistant layer is provided on the alumite layer and includes a polycrystalline ceramic; and an Al purity of the main portion is 99.00% or more.

The inventors discovered that there is an association between the Al purity of the main portion and the particle resistance of the particle-resistant layer. In the semiconductor manufacturing apparatus member according to the invention, the Al purity of the main portion is set to 99.00% or more; and a high level of particle resistance can be provided.

In the semiconductor manufacturing apparatus member according to the invention, it is also favorable for the thickness of the particle-resistant layer to be less than the thickness of the alumite layer.

In the semiconductor manufacturing apparatus member according to the invention, the nanolevel fine structure of the particle-resistant layer is controlled. Therefore, there are cases where the internal stress of the particle-resistant layer is larger than that of a conventional particle-resistant layer. In the invention, the thickness of the particle-resistant layer is set to be small compared to the thickness of the alumite layer; therefore, for example, discrepancies such as damage of the particle-resistant layer and the like caused by the internal stress, etc., can be reduced.

In the semiconductor manufacturing apparatus member according to the invention, it is also favorable for the thickness of the alumite layer to be at least 5 μm and 70 μm or less.

In the semiconductor manufacturing apparatus member according to the invention, a high level of particle resistance can be provided.

In the semiconductor manufacturing apparatus member according to the invention, it is also favorable for the thickness of the particle-resistant layer to be at least 1 μm and 10 μm or less.

By setting the thickness of the particle-resistant layer to be sufficiently small, i.e., 10 μm or less, discrepancies such as the damage of the particle-resistant layer, etc., can be reduced more effectively. Also, it is practically favorable to set the thickness to be at least 1 μm.

In the semiconductor manufacturing apparatus member according to the invention, it is also favorable for the concentration of Si element included in the main portion to be less than 1.0%.

According to the invention, a high level of particle resistance can be provided.

In the semiconductor manufacturing apparatus member according to the invention, it is also favorable for the concentration of Mg element included in the main portion to be 0.05% or less.

According to the invention, a high level of particle resistance can be provided.

In the semiconductor manufacturing apparatus member according to the invention, it is also favorable for the particle-resistant layer to include at least one type selected from the group consisting of an oxide of a rare-earth element, a fluoride of a rare-earth element, and an acid fluoride of a rare-earth element.

According to the invention, the particle resistance of the particle-resistant layer can be increased.

In the semiconductor manufacturing apparatus member according to the invention, it is also favorable that the particle-resistant layer includes an oxide of a rare-earth element and the rare-earth element to be at least one selected from the group consisting of Y, Sc, Yb, Ce, Pr, Eu, La, Nd, Pm, Sm, Gd, Tb, Dy, Ho, Er, Tm, and Lu.

According to the invention, the particle resistance of the particle-resistant layer can be increased further.

In the semiconductor manufacturing apparatus member according to the invention, it is also favorable for the average crystallite size of the polycrystalline ceramic to be at least 3 nm and 50 nm or less.

According to the invention, the particle resistance of the particle-resistant layer can be increased.

In the semiconductor manufacturing apparatus member according to the invention, it is also favorable for the average crystallite size to be at least 3 nm and 30 nm or less.

According to the invention, the particle resistance of the particle-resistant layer can be increased further.

In the semiconductor manufacturing apparatus member according to the invention, it is also favorable for the particle-resistant layer to have an arithmetic average height Sa of 0.060 or less after a reference plasma resistance test is performed in which the semiconductor manufacturing apparatus member is exposed to a plasma.

In the invention, the arithmetic average height Sa of the particle-resistant layer after a reference plasma resistance test is 0.060 or less and is extremely small. That is, the particle-resistant layer has exceedingly high particle resistance. Therefore, for example, even when used in an environment having a plasma density higher than that of a conventional plasma density, an exceedingly high level of particle resistance can be provided.

In the semiconductor manufacturing apparatus member according to the invention, it is also favorable that the particle-resistant layer is formed by aerosol deposition in which an aerosol containing fine particles of a brittle material that forms the particle-resistant layer dispersed in a gas is ejected from a nozzle to impact against a surface of the alumite layer.

In the semiconductor manufacturing apparatus member according to the invention, it is also favorable that the aerosol deposition is conducted at room temperature.

The semiconductor manufacturing apparatus according to the invention includes at least one of the semiconductor manufacturing apparatus members recited above.

According to the semiconductor manufacturing apparatus of the invention, a high level of particle resistance can be provided.

A display manufacturing apparatus according to the invention includes at least one of the semiconductor manufacturing apparatus members recited above.

According to the display manufacturing apparatus of the invention, a high level of particle resistance can be provided.

Embodiments of the invention will now be described with reference to the drawings. Similar components in the drawings are marked with the same reference numerals; and a detailed description is omitted as appropriate.

FIG. 1 is a cross-sectional view illustrating a semiconductor manufacturing apparatus including a semiconductor manufacturing apparatus member according to an embodiment.

The semiconductor manufacturing apparatus 100 illustrated in FIG. 1 includes a chamber 110, a semiconductor manufacturing apparatus member 120, and an electrostatic chuck 160. For example, the semiconductor manufacturing apparatus member 120 is called a top plate or the like and is provided in the upper part inside the chamber 110. The electrostatic chuck 160 is provided in the lower part inside the chamber 110. That is, the semiconductor manufacturing apparatus member 120 is provided above the electrostatic chuck 160 inside the chamber 110. An object to be held such as a wafer 210 or the like is placed on the electrostatic chuck 160.

In the semiconductor manufacturing apparatus 100, high frequency power is supplied; and, for example, a source gas such as a halogen-based gas or the like is introduced to the interior of the chamber 110 as in arrow Al illustrated in FIG. 1. The source gas that is introduced to the interior of the chamber 110 is plasmatized in a region 191 between the electrostatic chuck 160 and the semiconductor manufacturing apparatus member 120.

Here, if particles 221 generated in the chamber 110 adhere to the wafer 210, there are cases where a discrepancy occurs in the manufactured semiconductor device. Then, there are cases where the yield of the semiconductor device and the productivity decrease. Therefore, plasma resistance of the semiconductor manufacturing apparatus member 120 is necessary.

The semiconductor manufacturing apparatus member according to the embodiment may be a member arranged in the chamber periphery and/or at a position other than the upper part in the chamber. For example, the semiconductor manufacturing apparatus member according to the embodiment may be a member included in the sidewall inside the chamber. Also, the semiconductor manufacturing apparatus in which the semiconductor manufacturing apparatus member is used is not limited to the example of FIG. 1 and includes any semiconductor manufacturing apparatus (semiconductor processing apparatus) performing processing such as annealing, etching, sputtering, CVD, etc.

Figure 2:
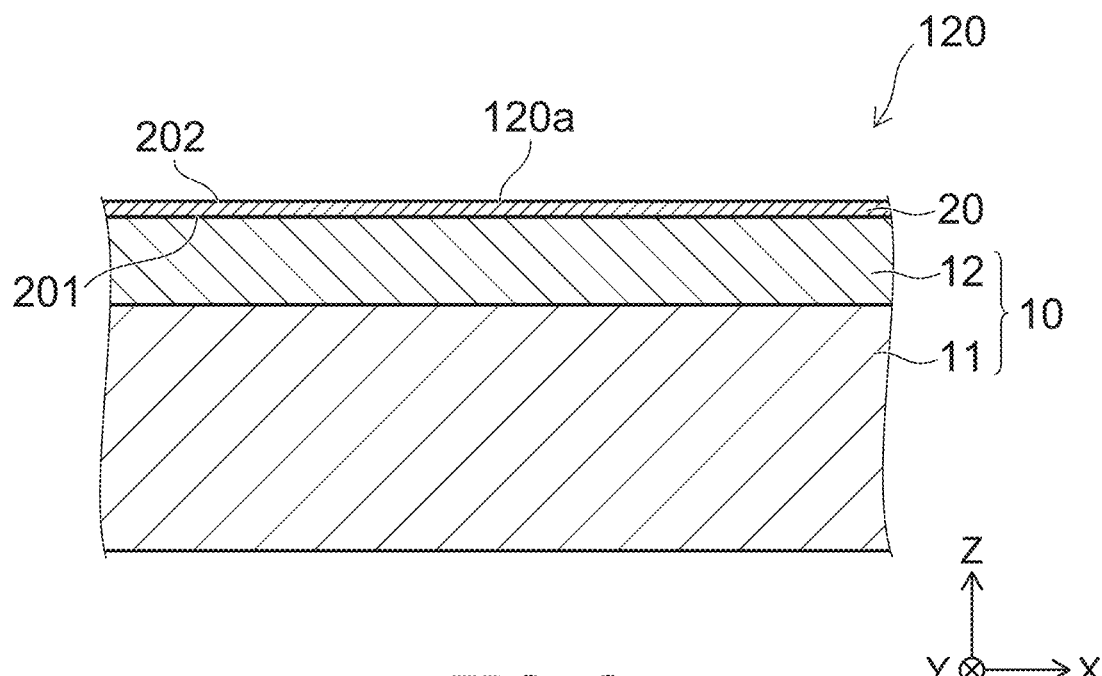
FIG. 2 is a cross-sectional view illustrating the semiconductor manufacturing apparatus member according to the embodiment.

FIG. 2 is a cross-sectional view illustrating the semiconductor manufacturing apparatus member according to the embodiment.

Figure 3:
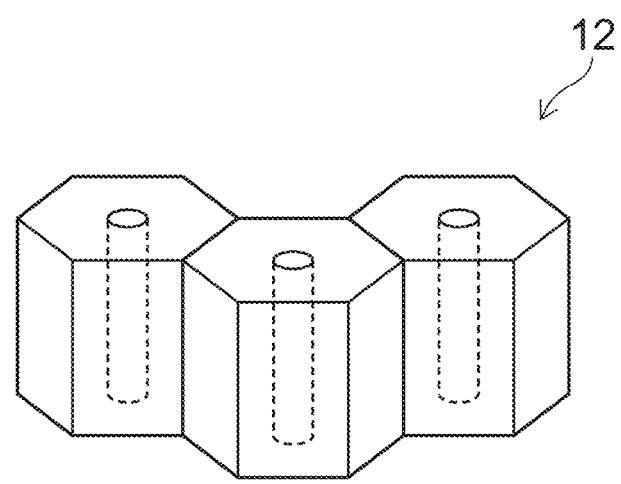
FIG. 3 is a schematic view illustrating the structure of the alumite layer of the semiconductor manufacturing apparatus member according to the embodiment.

FIG. 3 is a schematic view illustrating the structure of the alumite layer of the semiconductor manufacturing apparatus member according to the embodiment.

As shown in FIG. 2, the semiconductor manufacturing apparatus member 120 includes a base 10 and a particle-resistant layer 20.

In the following description, the stacking direction of the base 10 and the particle-resistant layer 20 is taken as a Z-axis direction (one example of the first direction). One direction perpendicular to the Z-axis direction is taken as an X-axis direction. A direction perpendicular to the Z-axis direction and the X-axis direction is taken as a Y-axis direction.

The base 10 includes a main portion 11, and an alumite layer 12 provided on the main portion 11. The main portion 11 includes aluminum. The main portion 11 includes, for example, aluminum or an aluminum alloy. The alumite layer 12 includes aluminum oxide ($Al_2O_3$). The alumite layer 12 is formed by performing alumite processing of the main portion 11. In other words, the alumite layer 12 is an anodic oxidation film covering the front surface of the main portion 11. The thickness of the alumite layer 12 is, for example, at least about 5 micrometers (μm) and about 70 μm or less. The thickness of the alumite layer 12 favorably is at least 5 μm and 50 μm or less.

Generally, the processes of the alumite processing include a process of forming a dense aluminum oxide layer (a covering film) on the front surface of a base including aluminum, a process of growing the aluminum oxide layer, and as necessary, a sealing process and a drying process. Among these processes, porous aluminum oxide which has holes (pits) is formed in the process of growing the aluminum oxide layer. As shown in FIG. 3, the alumite layer 12 has a porous structure unique to alumite and has, for example, a columnar structure. For example, the existence or absence of the porous structure can be confirmed by observing using a scanning electron microscope (SEM). That is, it can be discriminated according to the existence or absence of the porous structure whether the aluminum oxide layer is formed by alumite processing or whether the aluminum oxide layer is formed by another method (e.g., thermal spraying, etc.).

By setting the Al purity of the main portion 11 to be high, i.e., 99.00% or more, it is possible to provide a high level of particle resistance even for a structure in which the base 10 includes the main portion 11 and the alumite layer 12, and the particle-resistant layer 20 is provided on the base 10. The "%" of the Al purity is the mass %. For example, the Al purity can be measured by glow discharge mass spectrometry (GDMS). Although GDMS measures according to, for example, the spot diameter of a laser, the sample size which can be measured can be adjusted as appropriate; and a flat cell technique in an Ar atmosphere can be employed.

In this specification, "high particle resistance" means that the amount of particles generated by plasma irradiation is low.

It is also favorable for the concentration of Si element included in the main portion 11 to be less than 1.0%. It is also favorable for the concentration of Mg element included in the main portion 11 to be 0.05% or less. The "%" of the concentration of Si element and the concentration of Mg element is the mass %. For example, similarly to the measurement of the Al purity, the concentration of Si element and the concentration of Mg element can be measured by GDMS.

In the semiconductor manufacturing apparatus member 120, for example, pure aluminum (1000 series) according to JIS H 4140: 1988 can be used as the main portion 11.

In the invention, the "high level of particle resistance" that is realizable by controlling the nanolevel fine structure can be evaluated using the "reference plasma resistance test" described below as a reference technique. Specifically, the arithmetic average height Sa of the particle-resistant layer 20 after the reference plasma resistance test of the semiconductor manufacturing apparatus member 120 being 0.060 or less is defined as "providing a high level of particle resistance" in the specification.

The reference plasma resistance test will now be described in detail.

An inductively coupled plasma reactive ion etching apparatus (the Muc-21Rv-Aps-Se/made by Sumitomo Precision Products Co.) is used as the plasma etching apparatus for the reference plasma resistance test. The conditions of the plasma etching include an ICP (Inductively Coupled Plasma) output of 1500 W as the power supply output, a bias output of 750 W, a gas mixture of $CHF_3$ gas at 100 ccm and $O_2$ gas at 10 ccm as the process gas, a pressure of 0.5 Pa, and a plasma etching time of 1 hour. The state of a front surface 120a (a front surface 202 of the particle-resistant layer 20) of the semiconductor manufacturing apparatus member 120 after plasma irradiation is imaged using a laser microscope (e.g., the OLS4500/made by Olympus). The details of the observation conditions, etc., are described below. The arithmetic average height Sa of the front surface after plasma irradiation is calculated from the obtained image. Here, the arithmetic average height Sa is the two-dimensional arithmetic average roughness Ra extended three-dimensionally, and is a three-dimensional roughness parameter (a three-dimensional height direction parameter). Specifically, the arithmetic average height Sa is the volume of the portion enclosed with the surface-height surface and the mean plane divided by the measured area. In other words, the arithmetic average height Sa is defined by the following formula, in which the mean plane is the xy plane, the vertical direction is the z-axis, and the measured surface-height curve is z(x, y). Here, "A" in Formula (1) is the measured area.

[Formula 1]

$$Sa = \frac{1}{A} \int\int_A |z(x, y)| dx dy \qquad \text{Formula (1)}$$

Although the value of the arithmetic average height Sa basically is independent of the measurement technique, the calculations of the "reference plasma resistance test" of the specification are performed under the following conditions. A laser microscope is used to calculate the arithmetic average height Sa. Specifically, the laser microscope "OLS4500/made by Olympus" is used. An objective lens of the MPLAPON100xLEXT (a numerical aperture of 0.95, a working distance of 0.35 mm, a focus spot diameter of 0.52 μm, and a measurement region of 128×128 μm) is used; and the magnification is set to 100 times. The λc filter of the waviness component removal is set to 25 μm. The measurement is performed at any three locations; and the average value is used as the arithmetic average height Sa. Otherwise, the three-dimensional surface texture international standard ISO 25178 is referred to as appropriate.

The configuration of the base 10 (the main portion 11) is not particularly limited and may be a flat plate, or may be a configuration including a concave surface, a convex surface, etc. Also, the base 10 (the main portion 11) may have a ring configuration or a configuration including a level difference.

According to one aspect of the invention, a smooth front surface of the base 10 (the front surface of the alumite layer 12) contacting the particle-resistant layer 20 is favorable to form a good particle-resistant layer 20. According to one aspect of the invention, the unevenness of the front surface of the alumite layer 12 is removed by, for example, performing at least one of blasting, physical polishing, chemical mechanical polishing, or lapping of the front surface. For example, it is favorable to perform such an unevenness removal so that the resulting front surface of the alumite layer 12 is such that the arithmetic average roughness Ra is 0.2 μm or less, and more favorably 0.1 μm or less, or such that the maximum height roughness Rz is 3 μm or less. The arithmetic average roughness Ra and the maximum height roughness Rz conform to JIS B 0601:2001 and can be measured by, for example, the surface roughness measuring instrument "SURFCOM130A/made by Tokyo Seimitsu Co."

As shown in FIG. 2, it is favorable for the thickness (the length along the Z-axis direction) of the particle-resistant layer 20 to be less than the thickness of the alumite layer 12. In the semiconductor manufacturing apparatus member 120, the nanolevel fine structure of the particle-resistant layer 20 is controlled. Therefore, there are cases where the internal stress of the particle-resistant layer 20 is larger than that of a conventional particle-resistant layer. Because the thickness in the first direction of the particle-resistant layer 20 is small compared to the thickness in the first direction of the alumite layer 12, for example, discrepancies such as the damage of the particle-resistant layer 20 and the like caused by the internal stress, etc., can be reduced.

The thickness of the particle-resistant layer 20 is, for example, at least 1 μm and 10 μm or less. By setting the thickness of the particle-resistant layer 20 to be sufficiently small, i.e., 10 μm or less, the discrepancies such as the damage of the particle-resistant layer 20, etc., can be reduced more effectively. Also, it is practically favorable for the thickness to be at least 1 μm.

In the specification, the thicknesses of the particle-resistant layer 20 and the alumite layer 12 are determined as follows.

The thickness can be confirmed by cutting the semiconductor manufacturing apparatus member 120 and observing the fractured surface by using a scanning electron microscope (SEM). For example, SEM may be performed using the HITACHI S-5500 and the SEM observation conditions of a magnification of 5000 times and an acceleration voltage of 15 kV.

Two fractured samples are constructed; the film thickness is measured in at least five locations; and the average of the measured values of the ten or more points is used as the film thickness.

The particle-resistant layer 20 includes a polycrystalline ceramic. The particle-resistant layer 20 includes, for example, at least one type selected from the group consisting of an oxide of a rare-earth element, a fluoride of a rare-earth element, and an acid fluoride of a rare-earth element. For example, at least one selected from the group consisting of Y, Sc, Yb, Ce, Pr, Eu, La, Nd, Pm, Sm, Gd, Tb, Dy, Ho, Er, Tm, and Lu is an example of the rare-earth element. More specifically, the particle-resistant layer 20 includes at least one selected from the group consisting of an oxide of yttrium ($Y_2O_3$ or $Y_\alpha O_\beta$ (having a nonstoichiometric composition)), an yttrium oxyfluoride (YOF, $Y_5O_4F_7$, $Y_6O_5F_8$, $Y_7O_6F_9$, or $Y_{17}O_{14}F_{23}$), $(YO_{0.826}F_{0.17})F_{1.174}$, $YF_3$, $Er_2O_3$, $Gd_2O_3$, $Nd_2O_3$, $Y_3Al_5O_{12}$, $Y_4Al_2O_9$, $Er_3Al_5O_{12}$, $Gd_3Al_5O_{12}$, $Er_4Al_2O_9$, $ErAlO_3$, $Gd_4Al_2O_9$, $GdAlO_3$, $Nd_3Al_5O_{12}$, $Nd_4Al_2O_9$, and $NdAlO_3$. The particle-resistant layer 20 may include at least one selected from the group consisting of Fe, Cr, Zn, and Cu.

For example, the particle-resistant layer 20 includes yttrium and at least one of fluorine or oxygen. For example, yttrium oxide ($Y_2O_3$), yttrium fluoride ($YF_3$), or yttrium oxyfluoride (YOF) is a major component of the particle-resistant layer 20.

In the specification, "major component" refers to the inclusion of more than 50% of the component, and favorably 70% or more, more favorably 90% or more, more favorably 95% or more, and most favorably 100%. Here, "%" is, for example, the mass %.

Or, the particle-resistant layer 20 may be a compound other than an oxide, a fluoride, and an oxyfluoride. Specifically, a compound (a chloride or a bromide) including Cl element and/or Br element are examples.

The particle-resistant layer 20 has a surface 201 on the alumite layer 12 side, and the front surface 202 on the side opposite to the surface 201. The particle-resistant layer 20 contacts the alumite layer 12 at the surface 201. The front surface 202 is the front surface of the semiconductor manufacturing apparatus member 120.

For example, the particle-resistant layer 20 can be formed by "aerosol deposition". "Aerosol deposition" is a method of forcing an "aerosol" including fine particles including a brittle material dispersed in a gas from a nozzle toward a base such as a metal, glass, a ceramic, a plastic, etc., causing the brittle material fine particles to collide with the base, causing the fine particles to deform and fragment due to the impact of the collisions, and causing the fine particles to bond to directly form a layer structural component (also called a film structural component) made of the constituent materials of fine particles on the base.

In the example, for example, an aerosol that is a mixture of a gas and fine particles of a ceramic material such as yttria or the like having excellent particle resistance is forced toward the base 10 (the alumite layer 12) to form the layer structural component (the particle-resistant layer 20).

According to aerosol deposition, a heating unit, a cooling unit, or the like is not particularly necessary; it is possible to form the layer structural component at room temperature; and a layer structural component that has a mechanical strength equal to or greater than that of a sintered body can be obtained. Also, it is possible to diversely change the density, the fine structure, the mechanical strength, the electrical characteristics, etc., of the layer structural component by controlling the configuration and the composition of the fine particles, the conditions causing the fine particles to collide, etc.

In this specification, "polycrystal" refers to a structure body in which crystal particles are bonded/integrated. A crystal substantially includes one crystal particle. Normally, the diameter of the crystal particle is at least 5 nanometers (nm). However, the crystal particles are a polycrystal in the case where fine particles are incorporated into the structural component without fragmenting.

Also, in the semiconductor manufacturing apparatus member 120, the particle-resistant layer 20 may include only a polycrystalline ceramic or may include a polycrystalline ceramic and an amorphous ceramic.

The average crystallite size of the polycrystalline ceramic of the particle-resistant layer 20 is at least 3 nm and 50 nm or less. It is favorable for the upper limit of the crystallite size to be 30 nm, more favorably 20 nm, and more favorably 15 nm. A favorable lower limit of the crystallite size is 5 nm.

In the invention, the "average crystallite size" can be determined by the following method.

First, a transmission electron microscope (TEM) image is imaged using at least a magnification of 400,000 times. The average value of the diameters of fifteen crystallites calculated using a circle approximation in the image is used as the average crystallite size. At this time, the crystallite can be discriminated more clearly by setting the sample thickness in the focused ion beam (FIB) processing to be sufficiently thin, i.e., about 30 nm. The imaging magnification can be selected as appropriate in the range of 400,000 times or more.

Also, in this specification, in the case where the primary particle is a dense particle, "fine particle" refers to an average particle size of 5 micrometers (μm) or less when identified by a particle size distribution measurement, a scanning electron microscope, etc. In the case where the primary particle is a porous particle easily fragmented by impacting, "fine particle" refers to an average particle size of 50 μm or less.

In this specification, "aerosol" refers to a solid-gas mixed phase substance in which the fine particles described above are dispersed in a gas such as helium, nitrogen, argon, oxygen, dry air, a gas mixture including such elements, etc.; and although there are also cases where an "agglomerate" is partially included, "aerosol" refers to the state in which the fine particles are dispersed substantially solitarily. Although the gas pressure and the temperature of the aerosol are arbitrary when forming the layer structural component, it is desirable for the concentration of the fine particles in the gas at the timing when forced from the discharge aperture to be within the range of 0.0003 mL/L to 5 mL/L when the gas pressure is converted to 1 atmosphere and the temperature is converted to 20 degrees Celsius.

One feature of the process of aerosol deposition is that the process normally is performed at room temperature, and the formation of the layer structural component is possible at a temperature that is sufficiently lower than the melting point of the fine particle material, that is, several hundred degrees Celsius or less.

In this specification, "room temperature" refers to a temperature that is markedly lower than the sintering temperature of a ceramic, and refers to an environment of substantially 0 to 100° C.; and a room temperature of about 20° C.±10° C. is most general.

For the fine particles included in the powder body used as the source material of the layer structural component, a brittle material such as a ceramic, a semiconductor, etc., can be used as a major body, and fine particles of the same material can be used solitarily or fine particles having different particle sizes can be mixed; and it is possible to mix, combine, and use different types of brittle material fine particles. It is also possible to use fine particles of a metal material, an organic material, etc., by mixing the fine particles of the metal material, the organic material, etc., with the brittle material fine particles and coating the fine particles of the metal material, the organic material, etc., onto the surfaces of the brittle material fine particles. Even in such cases, the brittle material is the major part of the formation of the layer structural component.

In this specification, "powder body" refers to the state in which the fine particles described above are naturally coalesced.

For the hybrid structural component formed by such techniques, in the case where crystalline brittle material fine particles are used as the source material, the portion of the layer structural component of the hybrid structural component is a polycrystalline body having a small crystal particle size compared to the source material fine particles; and there are many cases where the crystals of the polycrystalline body have substantially no crystal orientation. Also, a grain boundary layer that is made of a glass layer substantially does not exist at the interface between the brittle material crystals. Also, in many cases, the layer structural component portion of the hybrid structural component forms an "anchor layer" that sticks into the front surface of the base (in the example, the base 10/alumite layer 12). The layer structural component, in which the anchor layer is formed, is formed and adhered securely to the base with exceedingly high strength.

A layer structural component that is formed by aerosol deposition possesses sufficient strength and is clearly different from a so-called "powder compact" having a state in which the fine particles are packed together by pressure and the form is maintained by physical adhesion.

For aerosol deposition, it can be confirmed that fragmentation/deformation occurs for the brittle material fine particles flying onto the base by using X-ray diffraction, etc., to measure the size of the brittle material fine particles used as the source material and the crystallite (crystal particle) size of the brittle material structural component that is formed. In other words, the crystallite size of the layer structural component formed by aerosol deposition is smaller than the crystallite size of the source material fine particles. "New major surfaces" are formed at the "shift surfaces" and/or the "fracture surfaces" formed by the fine particles fragmenting and/or deforming; and the "new major surfaces" are in the state in which atoms that existed in the interior of the fine particle and were bonded to other atoms are exposed. It is considered that the layer structural component is formed by the new major surfaces, which are active and have high surface energy, being bonded to the surfaces of adjacent brittle material fine particles, bonded to new major surfaces of adjacent brittle materials, or bonded to the front surface of the base.

In the case where an appropriate amount of hydroxide groups exists at the surfaces of the fine particles in the aerosol, it also may be considered that the bonding occurs due to mechano-chemical acid-base dehydration reactions occurring due to local shifting stress, etc., between the fine particles or between the structural component and the fine particles when the fine particles collide. It is considered that adding a continuous mechanical impact force from the outside causes these phenomena to occur continuously; the progression and densification of the bonds occur due to the repetition of the deformation, the fragmentation, etc., of the fine particles; and the layer structural component that is made of the brittle material grows.

For example, when the particle-resistant layer 20 is formed by aerosol deposition, the crystallite size of the particle-resistant layer 20 which is a ceramic layer has a dense fine structure that is small compared to that of a ceramic sintered body, a thermal-sprayed film, etc. Thereby, the particle resistance of the semiconductor manufacturing apparatus member 120 according to the embodiment is higher than the particle resistances of a sintered body or a thermal-sprayed film. Also, the probability of the semiconductor manufacturing apparatus member 120 according to the embodiment being a generation source of particles is lower than the probability of a sintered body, a thermal-sprayed film, etc., being a generation source of particles.

An example of the semiconductor manufacturing apparatus member 120 according to the invention being manufactured by, for example, aerosol deposition and an apparatus used for the manufacturing will now be described. The apparatus that is used for the aerosol deposition includes a chamber, an aerosol supplier, a gas supplier, an exhaust part, and a pipe. For example, a stage where the base 10 is disposed, a driver, and a nozzle are disposed in the chamber. The positions of the nozzle and the base 10 disposed on the stage can be changed relatively by the driver. At this time, the distance between the nozzle and the base 10 may be constant or may be changeable. Although an aspect in which the driver drives the stage is shown in the example, the driver may drive the nozzle. The drive directions are, for example, the XYZθ-directions.

The aerosol supplier is connected with the gas supplier by a pipe. In the aerosol supplier, an aerosol in which a gas and source material fine particles are mixed is supplied to the nozzle via the pipe. The apparatus further includes a powder body supplier supplying the source material fine particles. The powder body supplier may be disposed in the aerosol supplier or may be disposed separately from the aerosol supplier. Also, an aerosol former that mixes the source material fine particles and the gas may be included separately from the aerosol supplier. A homogeneous structural component can be obtained by controlling the supply amount from the aerosol supplier so that the amount of the fine particles forced from the nozzle is constant.

The gas supplier supplies nitrogen gas, helium gas, argon gas, air, etc. Although compressed air in which, for example, impurities such as moisture, oil, etc., are low is used in the case where the supplied gas is air, it is favorable to further provide an air processor to eliminate the impurities from the air.

An example of the operation of the apparatus used for aerosol deposition will now be described. In the state in which the base 10 is disposed on the stage inside the chamber, the chamber interior is depressurized to atmospheric pressure or less, and specifically to about several hundred Pa by an exhaust part such as a vacuum pump, etc. On the other hand, the internal pressure of the aerosol supplier is set to be higher than the internal pressure of the chamber. The internal pressure of the aerosol supplier is, for example, several hundred to several tens of thousands Pa. The powder body supplier may be at atmospheric pressure. The fine particles in the aerosol are accelerated by the pressure difference between the chamber and the aerosol supplier, etc., so that the jet velocity of the source material particles from the nozzle is in the range of subsonic speed to supersonic speed (50 to 500 m/s). The jet velocity is controlled by the gas type and the flow velocity of the gas supplied from the gas supplier, the configuration of the nozzle, the length and/or the inner diameter of the pipe, the exhaust amount of the exhaust part, etc. For example, a supersonic nozzle such as a Laval nozzle, etc., also can be used as the nozzle. The fine particles in the aerosol are forced at a high speed from the nozzle, collide with the base 10, are pulverized or deformed, and are deposited on the base 10 as a structural component (the particle-resistant layer 20). By changing the relative positions of the base 10 and the nozzle, a hybrid structural component (the semiconductor manufacturing apparatus member 120) that includes the structural component (the particle-resistant layer 20) having a prescribed surface area on the base 10 is formed.

Also, a pulverizer for pulverizing the agglomeration of fine particles before being forced from the nozzle may be provided. Any method can be selected as the pulverizing method of the pulverizer. For example, known methods include mechanical pulverization such as vibrating, colliding, or the like, static electricity, plasma irradiation, classification, etc.

The semiconductor manufacturing apparatus member according to the invention can be used favorably as various members in the semiconductor manufacturing apparatus, and especially as members used in an environment exposed to a corrosive high density plasma atmosphere. Specifically, a chamber wall, a shower plate, a liner, a shield, a window, an edge ring, a focus ring, etc., are examples.

Examples

While the invention is described further using the examples recited below, the invention is not limited to these examples.

1. Sample Construction

A test for the relationship between the type of the main portion 11 and the nanolevel fine structure of the particle-resistant layer 20 was performed using the base 10 having a flat plate configuration.

1-1 Preparation of Base

As the base 10, three bases were prepared in which the alumite layers 12 were provided on different types of main portions 11. The type of the main portion 11 and the Al purity were as shown in Table 1.

1-2 Source Material Particle

An yttrium oxide powder body was prepared as the source material particles. The average particle size of the source material particles was 0.4 μm.

1-3 Formation of Particle-Resistant Layer

The semiconductor manufacturing apparatus members of samples 1 to 3 were obtained by forming the yttrium oxide layers used to form the particle-resistant layers 20 on the six bases recited above. Aerosol deposition was used to construct the samples 1 to 3. The samples each were constructed at room temperature (about 20° C.). The construction time was 20 minutes for each of the samples. The thicknesses of the obtained particle-resistant layers 20 were as shown in Table 1.

The particle-resistant layer 20 of about 10 μm was obtained for each of the samples.

TABLE 1

| | Aluminum member 11 | | Particle-resistant layer 20 | | Particle-resistant layer arithmetic average height Sa (μm) | |
|---|---|---|---|---|---|---|
| No. | Type | Al purity (%) | Composition | Thickness (μm) | Before reference plasma resistance test | After reference plasma resistance test |
| Sample1 | 1070 | 99.70 | Y2O3 | 7 | 0.007 | 0.014 |
| Sample2 | 1100 | 99.00 | Y2O3 | 8 | 0.006 | 0.014 |
| Sample3 | 5052 | 97.25 | Y2O3 | 10 | 0.025 | 0.077 |

2. Sample Evaluation 2-1 Average Crystallite Size

The average crystallite size was calculated for the samples 1 to 3. Specifically, the average crystallite size was calculated from the average value of fifteen crystallites using a circle approximation in TEM images acquired at a magnification of 400,000 times. The average crystallite size was 30 nm or less for each of the samples.

2-2 Reference Plasma Resistance Test

The reference plasma resistance test was performed for the samples 1 to 3.

An inductively coupled plasma reactive ion etching apparatus (the Muc-21Rv-Aps-Se/made by Sumitomo Precision Products Co.) was used as the plasma etching apparatus. The conditions of the plasma etching included an ICP output of 1500 W as the power supply output, a bias output of 750 W, a gas mixture of $CHF_3$ gas at 100 ccm and $O_2$ gas at 10 ccm as the process gas, a pressure of 0.5 Pa, and a plasma etching time of 1 hour.

Then, the state of the front surface 202 of the particle-resistant layer 20 after plasma irradiation was imaged by a laser microscope. Specifically, the laser microscope "OLS4500/made by Olympus" was used; an objective lens of the MPLAPON100xLEXT (having a numerical aperture of 0.95, a working distance of 0.35 mm, a focus spot diameter of 0.52 μm, and a measurement region of 128×128 μm) was used; and the magnification was set to 100 times. The λc filter of the waviness component removal was set to 25 μm. Measurements were performed at three arbitrary locations; and the average value was used as the arithmetic average height Sa. Otherwise, the three-dimensional surface texture international standard ISO 25178 was referred to as appropriate. The values of the arithmetic average height Sa of the front surface 202 of the particle-resistant layer 20 before and after the reference plasma resistance test are as shown in Table 1.

As shown in Table 1, the arithmetic average height Sa of the front surface 202 before the reference plasma resistance test was small and was 0.025 μm or less for each of the samples; and the front surface of the particle-resistant layer 20 was exceedingly smooth even on the alumite layer 12. On the other hand, after the reference plasma resistance test, the arithmetic average height Sa of the front surface 202 was greater than 0.060 μm for the sample 3 in which the Al purity of the main portion 11 is less than 99.00%. It is considered that this shows that in the sample 3, the Al purity of the main portion 11 is low; therefore, the nanolevel fine structure control of the particle-resistant layer 20 is insufficient; and the generation of the particles cannot be suppressed sufficiently in a corrosive plasma environment having a higher density. On the other hand, for the samples 1 and 2 in which the aluminum purity of the main portion 11 is high and is 99.00% or more, the arithmetic average height Sa of the front surface 202 after the reference plasma resistance test was 0.014 μm or less and was exceedingly smooth even after the test. Accordingly, it was confirmed that when the Al purity of the main portion 11 is 99.00% or more, the nanolevel fine structure of the particle-resistant layer 20 can be controlled; and an exceedingly high level of particle resistance can be provided.

3. Construction of Ring-Shaped Semiconductor Manufacturing Apparatus Member

A test of the relationship between the Al purity of the main portion 11 and the nanolevel fine structure of the particle-resistant layer 20 was performed using the base 10 having a ring configuration.

3-1 Preparation of Base

A ring-shaped base in which the alumite layer 12 is provided on the main portion 11 was prepared as the base 10. The size of the base 10 was φ500 mm; and the 1070 series similar to that of the sample 1 was used as the main portion.

3-2 Source Material Particle

An yttrium oxide powder body was prepared as the source material particles. The average particle size of the source material particles was 0.4 μm.

3-3 Formation of Particle-Resistant Layer

The semiconductor manufacturing apparatus member was obtained by forming an yttrium oxide layer used to form the particle-resistant layer 20 on the ring-shaped base recited above. At this time, the yttrium oxide layer was formed on the inner perimeter surface of the ring-shaped base. Aerosol deposition was used to construct the yttrium oxide layer. The samples each were constructed at room temperature (about 20° C.). The thicknesses of the obtained particle-resistant layers 20 were 8 μm.

The thickness of the particle-resistant layer 20 formed on the ring-shaped base was measured as follows.

First, the semiconductor manufacturing apparatus member was cut into each ring-shaped base. The thickness of the particle-resistant layer of the fractured surface was measured by SEM observation. Two fractured samples were constructed; the film thickness was measured at five locations each; and the average of the ten points was used as the film thickness.

4. Sample Evaluation 4-1 Average Crystallite Size

The average crystallite size was calculated for the particle-resistant layer 20 on the ring-shaped base using a method similar to that of the samples 1 to 3 recited above. The average crystallite size was 10 nm.

4-2 Reference Plasma Resistance Test

Then, for the semiconductor manufacturing apparatus member of the ring-shaped base, similarly to the samples 1 to 3, the reference plasma resistance test was performed; and the arithmetic average height Sa before and after the test was measured. The arithmetic average height Sa before the test was 0.008 μm and was extremely small, and was 0.015 μm even after the test.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, and the like of the base, the alumite layer, the particle-resistant layer, etc., can be modified appropriately and are not limited to those illustrated.

Also, the components included in the embodiments described above can be combined within the limits of technical feasibility; and such combinations also are within the scope of the invention to the extent that the features of the invention are included.

What is claimed is:

1. A semiconductor manufacturing apparatus member, comprising:
    a base including a main portion which includes aluminum and an alumite layer provided at a front surface of the main portion; and
    a particle-resistant layer provided on the alumite layer and which includes a polycrystalline ceramic,
    wherein:
    the alumite layer has a thickness greater than a thickness of the particle-resistant layer,
    the thickness of the particle-resistant layer is in a range of 1-10 micrometers,
    an Al purity of the main portion is 99.00% or more,
    the particle-resistant layer is formed by aerosol deposition,
    and the particle-resistant layer has an arithmetic average height Sa of 0.060 μm or less after a reference plasma resistance test is performed in which the semiconductor manufacturing apparatus member is exposed to a plasma.

2. The semiconductor manufacturing apparatus member according to claim 1, wherein a concentration of Si element included in the main portion is less than 1.0%.

3. The semiconductor manufacturing apparatus member according to claim 1, wherein a concentration of Mg element included in the main portion is 0.05% or less.

4. The semiconductor manufacturing apparatus member according to claim 1, wherein the particle-resistant layer includes at least one type selected from the group consisting of an oxide of a rare-earth element, a fluoride of a rare-earth element, and an acid fluoride of a rare-earth element.

5. The semiconductor manufacturing apparatus member according to claim 4, wherein the particle-resistant layer includes an oxide of a rare-earth element and the rare-earth element is at least one selected from the group consisting of Y, Sc, Yb, Ce, Pr, Eu, La, Nd, Pm, Sm, Gd, Tb, Dy, Ho, Er, Tm, and Lu.

6. The semiconductor manufacturing apparatus member according to claim 1, wherein an average crystallite size of the polycrystalline ceramic is at least 3 nm and 50 nm or less.

7. The semiconductor manufacturing apparatus member according to claim 6, wherein the average crystallite size is at least 3 nm and 30 nm or less.

8. A semiconductor manufacturing apparatus, comprising the semiconductor manufacturing apparatus member according to claim 1.

9. A display manufacturing apparatus, comprising the semiconductor manufacturing apparatus member according to claim 1.

10. The semiconductor manufacturing apparatus member according to claim 1, wherein the alumite layer has been smoothed prior to application of the particle-resistant layer, so that the front surface of the alumite layer has an arithmetic average roughness Ra of 0.2 μm or less.

11. The semiconductor manufacturing apparatus member according to claim 1, wherein the alumite layer has been smoothed prior to application of the particle-resistant layer, so that the front surface of the alumite layer has an arithmetic average roughness Ra of 0.1 μm or less.

12. A semiconductor manufacturing apparatus member, comprising:
    a base including a main portion which includes aluminum and an alumite layer provided at a front surface of the main portion; and
    a particle-resistant layer provided on the alumite layer and which includes a polycrystalline ceramic,
    wherein:
    the alumite layer has a thickness greater than a thickness of the particle-resistant layer,
    an Al purity of the main portion is 99.00% or more,
    the particle-resistant layer is formed by aerosol deposition,
    and the thickness of the particle-resistant layer is in a range of 1-10 micrometers.

* * * * *